US012634640B2

(12) United States Patent
Vanden Broeck

(10) Patent No.: US 12,634,640 B2
(45) Date of Patent: May 19, 2026

(54) AUDIO SIGNAL REPRODUCTION

(71) Applicant: TENOR INC., Midhurst (CA)

(72) Inventor: Michel Vanden Broeck, Montréal (CA)

( * ) Notice: Subject to any disclaimer, the term of this patent is extended or adjusted under 35 U.S.C. 154(b) by 92 days.

(21) Appl. No.: 18/391,887

(22) Filed: Dec. 21, 2023

(65) Prior Publication Data

US 2024/0120892 A1    Apr. 11, 2024

Related U.S. Application Data

(63) Continuation of application No. PCT/CA2022/051056, filed on Jul. 4, 2022.

(60) Provisional application No. 63/217,846, filed on Jul. 2, 2021.

(51) Int. Cl.
*H04R 25/00* (2006.01)
*G11B 20/10* (2006.01)
*H03F 3/183* (2006.01)
*H03G 5/00* (2006.01)

(52) U.S. Cl.
CPC ..... *H04R 25/505* (2013.01); *G11B 20/10527* (2013.01); *H03F 3/183* (2013.01); *H03G 5/005* (2013.01); *H04R 25/43* (2013.01); *G11B 2020/10555* (2013.01); *H03F 2200/03* (2013.01); *H04R 2225/41* (2013.01)

(58) Field of Classification Search
CPC .. H04R 25/505; H04R 25/43; H04R 2225/41; H04R 3/04; H03F 3/183; H03F 2200/03; H03F 3/211; H03F 3/45071; H03F 2200/549; H03F 3/1855; H03F 3/185; H03F 5/005; H03F 5/00; G10H 1/14; G10H 1/16; G10H 2210/311; G11B 20/10527; G11B 2020/10555
See application file for complete search history.

(56) References Cited

U.S. PATENT DOCUMENTS

| | | | |
|---|---|---|---|
| 4,000,474 | A | 12/1976 | Todokoro |
| 5,636,284 | A | 6/1997 | Pritchard |
| 6,275,593 | B1 | 8/2001 | Garcia et al. |
| 6,560,341 | B1 | 5/2003 | Coyle |
| 2007/0248233 | A1 | 10/2007 | Oxford et al. |
| 2010/0116122 | A1 | 5/2010 | Sugawara |
| 2010/0232624 | A1 | 9/2010 | Zhang |
| 2013/0136278 | A1 | 5/2013 | Quilter |
| 2013/0278299 | A1 | 10/2013 | Eriksson |

(Continued)

FOREIGN PATENT DOCUMENTS

| | | | |
|---|---|---|---|
| ES | 2319956 | B2 | 5/2009 |
| JP | H06-342287 | A | 12/1994 |
| SU | 1261006 | A1 | 9/1986 |

OTHER PUBLICATIONS

International application No. PCT/CA2022/051056 International Search Report dated Oct. 28, 2022.

(Continued)

*Primary Examiner* — Tuan D Nguyen

(74) *Attorney, Agent, or Firm* — Anglehart et al.

(57) ABSTRACT

An amplifier stage uses a loaded transistor amplifier circuit including a load that causes greater second order harmonic distortion energy than third order harmonic distortion energy to be produced in said loaded transistor amplifier circuit for amplifying a source audio signal to produce an audio output signal. The spectrum of the fundamental orders of harmonic distortion is adjusted to improve perceived sound quality or listening enjoyment.

17 Claims, 9 Drawing Sheets

(56)　　　　　References Cited

U.S. PATENT DOCUMENTS

| | | |
|---|---|---|
| 2014/0254826 A1 | 9/2014 | Allen |
| 2021/0006913 A1 | 1/2021 | Olah et al. |

OTHER PUBLICATIONS

International application No. PCT/CA2022/051056 Written Opinion of the International Searching Authority dated Oct. 28, 2022.
Kanevsky, P., PKHarmonic VST Plugin—Audiophile Harmonics Generator. personal website, Mar. 1, 2021. online. Retrieved from the Internet:https://distortaudio.org/pkharmonic.html. Retrieved on Nov. 7, 2022.
Pass, N., H2 Harmonic Generator, personal website, 2018, online. Retrieved from the Internet: https://www.firstwatt.com/pdf/art_h2.pdf. Retrieved on Nov. 7, 2022.
Helmholtz, Apprehension of Quality of Tone, 1877, Pflügers Archiv, für Physiologie, vol. xiii, pp. 128-151.
Elizabeth et al., Von Békésy and cochlear mechanics, Hearing Research, vol. 293, Issues 1-2, Nov. 2012, pp. 31-43.
Sang Yeop Kwak and Suk Won Yi, Perception of Tonal Dissonance in Pure-Tone Compound Intervals, ICMPC 2000, Proceedings paper, printed on Aug. 18, 2016.
Josh H McDermott et al., Music perception, pitch, and the auditory system, Current Opinion in Neurobiology, vol. 18, Issue 4, Aug. 2008, pp. 452-463.
R. Plomp and W. J. M. Levelt, Tonal Consonance and Critical Bandwidth, The Journal of the Acoustical Society of America 38, 548 (1965); https://doi.org/10.1121/1.1909741, vol. 38, Issue 4 > 10.1121/1.1909741.
S. S. Stevens and E. B. Newman, On the Nature of Aural Harmonics1, Proc Natl Acad Sci U S A. Nov. 1936; 22(11):668-672. doi: 10.1073/pnas.22.11.668.

R. L. Wegel and C. E. Lane, The Auditory Masking of One Pure Tone by Another and its Probable Relation to the Dynamics of the Inner Ear, Physical Review Journals Archive, 23, 266—Published Feb. 1, 1924.
Nigel P. Cooper, Harmonic distortion on the basilar membrane in the basal turn of the guinea-pig cochlea, The Journal of Physiology, vol. 509, Issue1, May 1998, pp. 277-288, https://doi.org/10.1111/j.1469-7793.1998.277bo.x.
Wikipedia, Valve amplifier, the attached version edited by Binksternet at 03:43, Nov. 1. https://en.wikipedia.org/wiki/Valve_amplifier (the present address (URL) is a permanent link to this version, which may differ significantly from the attached revision).
Wikipedia, Volley theory, the attached version was last modified on Aug. 7, 2016, printed Aug. 22, 2016. https://en.wikipedia.org/w/index.php?title=Volley_theory&oldid=733402570.
Allen, Book, Nonlinear cochlear signal processing, (2001).
Guy D. Moore, Book, Physics of Music Lecture Notes, Jul. 14, 2006.
Patentability search material: Earl R. Geddes, The perception of Distortion.
Patentability search material: The Traveling Wave.
International application No. PCT/CA2022/051056 Supplementary search report dated Oct. 6, 2023.
A Dictionary of Electronics and Electrical Enging, Definition of "Load". Https://www.oxforderence.com/view/10.1093/acref/9780198725725.001.0001/acref-9780198725725-e-2686?rskey=rFsS6i&result=1&print(Oxford,2018)(accessed Dec. 30, 2021)(Year: 2018).
Corresponding Canadian patent application No. 3,219,724 Office Action dated Jan. 2, 2024.
Corresponding Canadian patent application No. 3,219,724 Office Action dated Jul. 29, 2024.
Corresponding Japanese patent application No. 2025-521423 examination report mailed Mar. 31, 2026.

AUDIO SIGNAL REPRODUCTION

CROSS-REFERENCE TO RELATED APPLICATIONS

This application claims priority from U.S. provisional patent application 63/217,846 filed Jul. 2, 2021, the contents of which are hereby incorporated by reference.

TECHNICAL FIELD

This patent application relates to the field of audio signal reproduction.

BACKGROUND

An audio amplifier's Total Harmonic Distortion (THD) specification is often used as a decisive measure of quality when comparing one amplifier to another. THD defines the combination of all orders of harmonic distortion. When an audio amplifier circuit amplifies a single frequency tone, say at a frequency of 1 kHz, the output signal will typically contain the amplified signal at 1 kHz with distortion energy at different orders, namely 2 kHz, 3 kHz, 4 kHz, 5 kHz, etc. While the harmonic distortion energy generally decreases with increasing order, many amplifiers reduce THD by using an amplifier circuit design that reduces the second order that contains the greatest amount of energy. These types of amplifiers have relatively greater odd orders of harmonic distortion than even orders.

Amplifiers with lower THD specification are typically regarded as best. Various techniques are employed to further reduce an amplifier's fundamental THD measurement thereby providing a lower THD specification for publication. Depending on the magnitude of the techniques employed to lower the THD of an amplifier, it is questionable whether a corresponding improvement in subjective quality is ever achieved. In fact, quite often the subjective quality actually degrades as a result of these techniques. THD specifications as a measure of subjective sound quality therefore are unreliable.

Vacuum tube amplifiers with their predominantly even order THD spectrum typically sound warm and smooth. Solid-state amplifiers with their predominantly odd order THD spectrum sound less so by comparison. Hybrid amplifiers comprised of both vacuum tube and solid-state technology have a mixture of both tube and solid-state orders of harmonic distortion and therefore have combined subjective sound quality of both vacuum tubes and solid-state. It is very subjective whether vacuum tube, solid-state or hybrid sound is best but the harmonic distortion spectrum of each technology is very unique and identifiable.

Harmonic distortions spectrums associated with each stage of production, post-production and reproduction of an audio media file combine to form a complex spectrum of harmonic distortion at the final output. Production of the master media file includes harmonic distortions associated with the recording equipment. Post-production includes the production harmonic distortions as well as those associated with the mixing and manufacturing of the final analogue or digital media file. Reproduction of the media file includes all of the aforementioned harmonic distortions but also those associated with the equipment utilized for playback including the transducers utilized for creating the final acoustic interface. Wired or wireless transmission technology in any of the stages also contributes unique harmonic distortions to the overall compound spectrum of harmonic distortion.

The THD formula accounts for the quantum of the overall compound spectrum of harmonic distortion but not the nuances of the structural relationship between one order of harmonic distortion and another. To properly understand the perceived quality of an audio signal, one needs to know the quantum of each order of harmonic distortion in the spectrum comprising the THD. Once this structural relationship is understood and presented along with the THD measurement, a more meaningful and reliable indication of perceived quality can be made.

SUMMARY

The sound quality of a reproduced audio signal is a combined function of the harmonic distortion of the audio signal, the employed transmission technology, the circuit topology of the amplifier including the cumulative effect from all of the amplifiers in the chain of reproduction. Distortions formed and recorded in the original master file combine with the harmonic distortion of the transmission technology and amplifying circuits to produce a compound harmonic distortion spectrum. These compound harmonic distortions contribute to the overall distortion of the system and are responsible for the overall sonic signature and the resultant perceived quality of sound. These distortions can be measured as individual orders of harmonic distortion which are multiples of the audio signal being reproduced. Typically, the 2nd, 3rd, 4th & 5th harmonics of distortion of an audio signal contribute the most to the sonic signature of an amplifier but there are cases where higher orders of distortion above the 5th order can as well.

Different technologies exhibit different spectrums. For example, vacuum tube amplifiers are dominant in even order harmonics but also have diminished odd order harmonics. Solid-state amplifiers are dominant in odd order harmonics but also have diminished even order harmonics. Amplifiers with predominate even order harmonics are typically smoother sounding subjectively and more natural sounding as a result. Solid-state amplifiers with predominate odd order harmonics are less so. The composition of the harmonic distortion spectrum requires both even and odd harmonic orders to be present and in a structured order to achieve what is considered balanced sound.

A balanced spectrum of harmonic distortion adheres to certain principles but is also somewhat subjective and personal as it depends on the physiology of one's hearing system and the normal age-related changes that occur over time. Having the ability to shape the harmonic distortion spectrum allows subjective changes based on the physiology of the target listener but also for amplifier designs to have a perceived sonic character that is not limited strictly to the technology of the amplifier as it is today. As an example, a vacuum tube amplifier's harmonics of distortion can be made to sound like a solid-state amplifier and vice versa. The benefit of this is very compelling as the reliability and energy efficiency of a solid-state amplifier can now perform like a vacuum tube amplifier.

Applicant's embodiment called a Harmonic Balancing Amplifier (HBA) is an adaptive harmonic spectrum amplifier used to adjust the spectrum of the fundamental orders of harmonic distortion. Input impedance loadings within the circuit produce an output impedance load on the audio signal which provides various spectrums of harmonic distortion having a compound effect on the overall spectrum. A single HBA circuit can produce an adjustable harmonic spectrum and a multiple HBA circuit can provide additional complex adjustability.

HBAs can be cascaded or paralleled using multiple circuits to further customize a best fit harmonic distortion spectrum. The output gain of a single or multiple HBA can be configured as either an audio source, preamplifier or power amplifier or in unity gain as part of an amplifier or standalone amplifier to provide preconditioning or post conditioning for a system and audio signal.

A further embodiment provides overall harmonic reduction to the audio signal which lowers all orders of harmonic distortion to allow greater flexibility in using the adjustability of single or multiple HBA circuits.

In some embodiments, an audio signal non-linear power amplifier may comprise a high impedance input, a low impedance output, an input stage connected to the input, the input stage comprising a transistor amplifier circuit including a load that causes, in use, the input stage to exhibit greater second order harmonic distortion energy than third order harmonic distortion energy, and an output stage connected to the input stage and to the low impedance output.

The load of the input stage may comprise a transistor string to reduce an amount of harmonic distortion by bending of the transfer function of the transistor amplifier circuit. The transistor string may comprise a selector switch for selecting a number of transistors active in the transistor string. The load of the input stage may comprise a variable resistance able to change the load to change a balance of the second order harmonic distortion energy with respect to the third order harmonic distortion energy. A total harmonic distortion generated by the amplifier may be less than 0.5%, or even less than 0.3%, of a signal amplitude at the low impedance output.

In some embodiments, an audio signal non-linear amplifier may comprising a high impedance input, a low impedance output, an input stage connected to the input, the input stage comprising a transistor amplifier circuit including an adjustable load that causes, in use, the input stage to exhibit as a function of the adjustable load different relative amounts of second order harmonic distortion energy and third order harmonic distortion energy, and an output stage connected to the input stage and to the low impedance output. The second order harmonic distortion energy may be greater than the third order harmonic distortion energy. The adjustable load of the input stage may comprise a transistor string to reduce an amount of harmonic distortion by bending of the transfer function of the transistor amplifier circuit. The transistor string may comprise a selector switch for selecting a number of transistors active in the transistor string. The adjustable load of the input stage may comprise a variable resistance able to change the load to change a balance of the second order harmonic distortion energy with respect to the third order harmonic distortion energy. A total harmonic distortion generated by the amplifier may be less than 0.5%, or even less than 0.3%, of a signal amplitude at the low impedance output.

In some embodiments, an audio signal power amplifier system may comprise a non-linear pre-amplifier having near unity or low gain comprising a high impedance input, a low impedance output, an input stage connected to the input, the input stage comprising a transistor amplifier circuit including an adjustable load that causes, in use, the input stage to exhibit as a function of the adjustable load different relative amounts of second order harmonic distortion energy and third order harmonic distortion energy, and an output stage connected to the input stage and to the low impedance output. The amplifier system may further comprise a non-linear power amplifier receiving the output stage, comprising a transistor circuit generating negligible second and fourth order harmonic distortion and non-negligible third and fifth order harmonic distortion. In this way, the system may provide higher second order harmonic distortion energy than third order harmonic distortion energy with decreasing energies at progressively higher order harmonics at an output of the non-linear power amplifier in response to an input audio signal provided to the high impedance input.

The load of the input stage may comprise a transistor string to reduce an amount of harmonic distortion by bending of the transfer function of the transistor amplifier circuit. The transistor string may comprise a selector switch for selecting a number of transistors active in the transistor string. The load of the input stage may comprise a variable resistance able to change the load to change a balance of the second order harmonic distortion energy with respect to the third order harmonic distortion energy. A total harmonic distortion generated by the amplifier may be less than 0.5%, or even less than 0.3%, of a signal amplitude at the low impedance output.

In some embodiments, an audio signal playback device may comprise a processor configured to receive an input soundtrack and to produce a second order harmonic copy thereof, a mixer configured to mix the input soundtrack with the second order harmonic copy to produce a simulation of second order harmonic distortion energy within the input soundtrack in a mixed soundtrack, a non-linear power amplifier receiving the mixed soundtrack, comprising a transistor circuit generating negligible second and fourth order harmonic distortion energy and non-negligible third and fifth order harmonic distortion energy. In this way, the audio signal playback device provides higher second order harmonic distortion energy than third order harmonic distortion energy with decreasing energies at progressively higher order harmonics. A total harmonic distortion generated by the device may be less than 0.5%, or even less than 0.3%, of a signal amplitude at the low impedance output.

BRIEF DESCRIPTION OF THE DRAWINGS

Certain embodiments can be better understood by way of the appended drawings and discussion.

DETAILED DESCRIPTION

Figure 1:
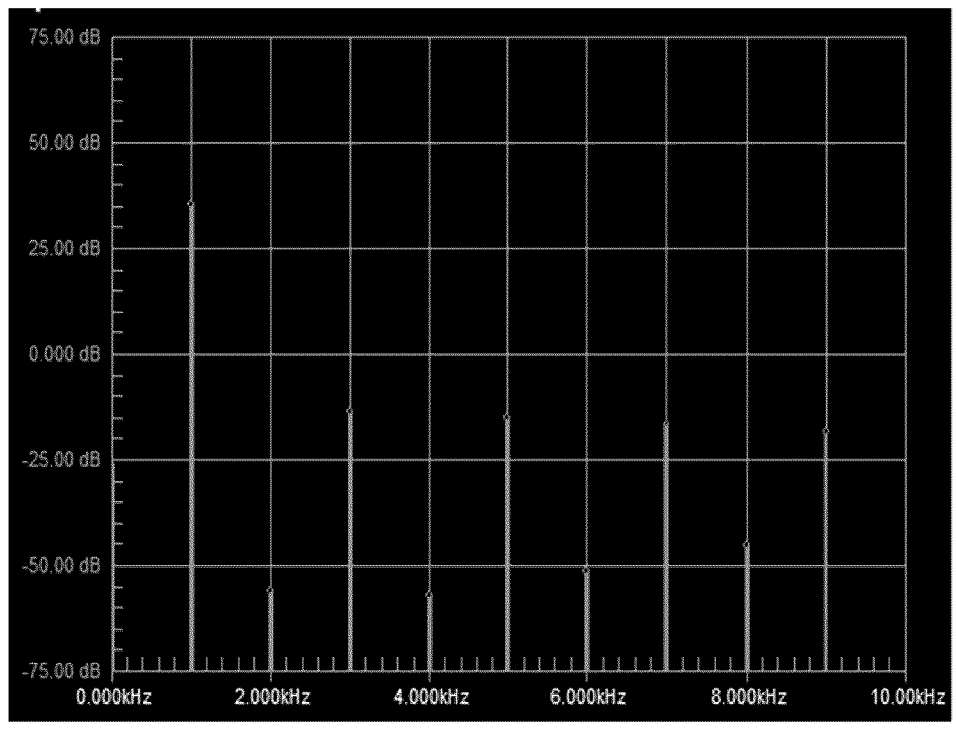
FIG. 1 illustrates the typical Fast Fourier Transform (FFT) of the output signal of an ordinary Class AB solid-state audio signal amplifier using the Federal Trade Commission (FTC) uniform test tone criterion of 1 kHz. The even harmonic distortions are very low in comparison to the odd orders of harmonic distortions. This spectrum is typical of a solid-state amplifier which is often characterized as more fatiguing and less intelligible than a vacuum tube amplifier.

FIG. 1 demonstrates how harmonic distortions behave in a conventional solid-state power audio amplifier using a single uniform 1 kHz test tone. Even order harmonic distortions are created at 2, 4, 6 and 8 kHz with odd order harmonic distortions at 3, 5, 7 and 9 kHz. The odd order harmonics are dominant and uniform compared with the lesser even orders of harmonic distortion. With a 35 dB output, the odd orders of harmonic distortion all measure in the approximate range of −17 dB. The even orders of harmonic distortion range from −55 dB at the second order to −45 dB at the eighth order showing a gradual increase of energy as the orders increase. This spectrum is typical of a solid-state amplifier which is often characterized as more fatiguing and less intelligible than a vacuum tube amplifier which has a dominant even order spectrum and diminished even and odd amplitudes as the orders increase with each odd order less than the preceding even order.

Figure 2:
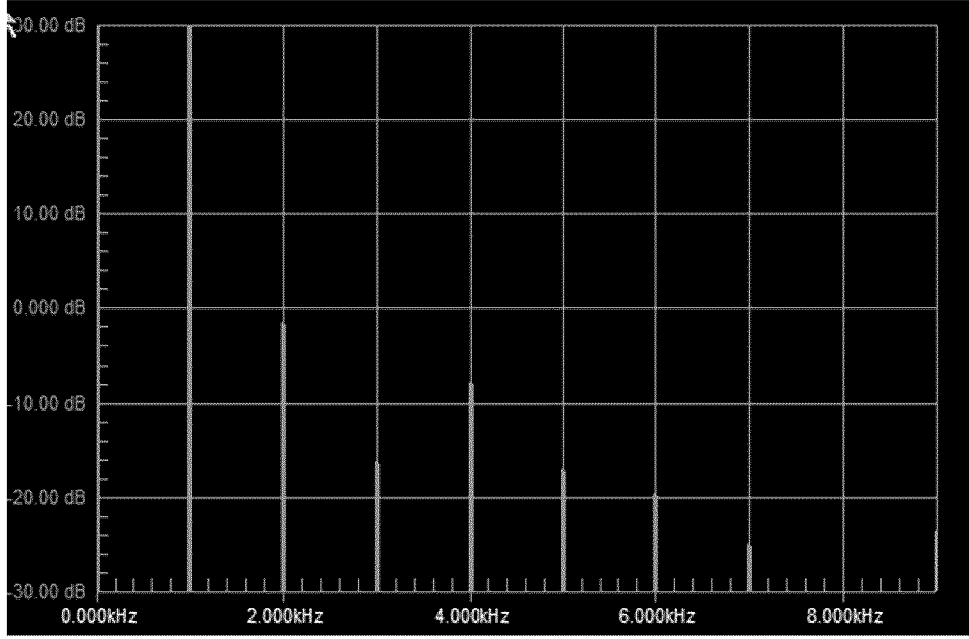
FIG. 2 illustrates the typical FFT of the output signal of an ordinary Class AB vacuum tube audio signal amplifier using the same FTC uniform test tone criterion of 1 kHz. The even order harmonic distortions are higher in comparison to the odd orders of harmonic distortions and are therefore deemed dominant. Dominant even order harmonics, compared to odd orders, with diminishing amplitudes as the orders increase, provide a sound that is characterized as less fatiguing and more intelligible than solid-state technology.

FIG. 2 shows for comparison a vacuum tube based audio power amplifier using a single uniform 1 kHz test tone. Even order harmonic distortions are created at 2, 4, 6 and 8 kHz with odd order harmonic distortions at 3, 5, 7 and 9 kHz. The even order harmonics are dominant with each odd order less than the preceding even order. With a 30 dB output, the even orders diminish with each successive even order and measure approximately between −2 dB at the 2nd order to −30 dB at the 8th. Each successive odd order harmonic is less than the preceding even order and measure approximately between −16 dB at the 3rd order to −24 dB at the 9th. The spectrum of odd orders diminishes with each successive order from the 3rd through to the 7th order and increases slightly only at the 9th which typically is not discernible.

The overall harmonic distortion of FIG. 2 is higher than that of FIG. 1 but conforms to a spectrum that is considered balanced whereas FIG. 1 does not. As a result, the perceived sonic quality of FIG. 2 is better providing less fatigue and greater intelligibility in spite of the overall higher harmonic distortion.

Figures 3, 4A, 4B, 4C, 4D:
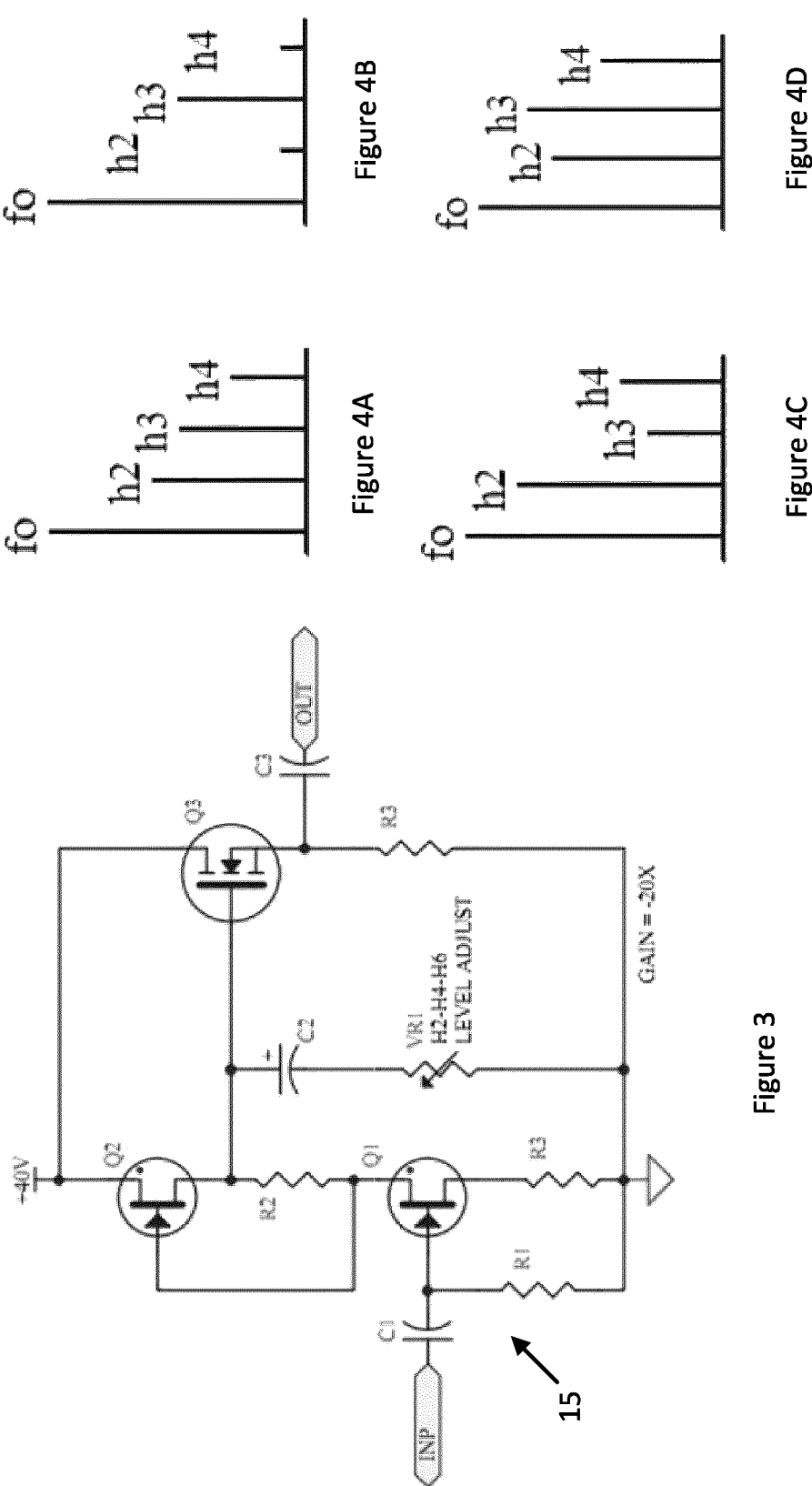
FIG. 3 is a schematic circuit diagram of the Applicant's HBA embodiment. A variable input load VR1/C2 impedance inversely varies the output impedance load on transistors Q1/Q2 with a gain of approximately 20 times or 26 dB thereby altering the orders of distortion of the audio signal output.
FIG. 4A is an illustrative graph of distortion measurements based on the circuit mentioned in FIG. 3 above using a single fundamental test frequency input signal f0 with a variable load VR1/C2 impedance set to high thereby creating a very low output impedance on transistors Q1/Q2. At the output, the composition of the orders of harmonic distortions h2, h3 and h4 demonstrate a sequential downward trend for both even and odd order harmonics as the orders increase.
FIG. 4B is an illustrative graph of distortion measurements based on the circuit mentioned in FIG. 3 above using a single fundamental test frequency input signal f0 with variable load VR1/C2 impedance set to moderate (approximately equal to the source impedance of the amplifier) thereby creating a moderate impedance on transistors Q1/Q2. At the output, the composition of the orders of harmonic distortions h2, h3 and h4 demonstrate dominant odd 3rd order harmonics with reduced even order harmonics.
FIG. 4C is an illustrative graph of distortion measurements based on the circuit mentioned in FIG. 3 above using a single fundamental test frequency input signal f0 with variable load VR1/C2 impedance set slightly higher than the source impedance thereby creating a slightly less than moderate impedance on transistors Q1/Q2. At the output, the composition of the orders of harmonic distortions h2, h3 and h4 demonstrate dominant even order harmonics with reduced odd order harmonics and decreasing amplitudes as the orders of harmonic distortions increase. The THD in FIG. 4C is greater than that of FIG. 4B.
FIG. 4D is an illustrative graph of distortion measurements based on the circuit mentioned in FIG. 3 above using a single fundamental test frequency input signal f0 with VR1/C2 impedance set to very low creating a very high loading effect on transistors Q1/Q2. At the output, the composition of the orders of harmonic distortions h2, h3 and h4 demonstrate dominant odd order harmonics with decreasing amplitude for both odd and even as the orders increase. The THD in FIG. 4D is greater than the THD in FIG. 4C.

FIG. 3 is a schematic circuit diagram of an audio amplifier circuit with a gain of approximately 20 times or 26 dB. The amplifier has a first stage comprising a transistor Q1 whose supply is provided by Q2. The amplifier has an output stage comprising a transistor Q3. The gain of the circuit can be varied without affecting the spectrum of harmonic distortion. The gain can also be close to unity when the function of the amplifier is to simply alter the spectrum of harmonic distortions in an audio signal.

The audio amplifier circuit of FIG. 3 can alter the output impedance by adjusting the input impedance using a combination of VR1/C2. This load can be either fixed or adjustable using a variable resistor at VR1 and/or a variable capacitor at the location of capacitor C2 for attaining different harmonic distortions necessary for balancing the overall harmonic distortion spectrum of an amplifier.

By adapting the values of VR1/C2 in the circuit 15 of FIG. 3 and by using a frequency dependent load circuit, it is also possible to generate various frequency dependent distortion spectrum profiles. As an example, such configurations could be used to change the distortion profile at medium frequencies leaving the low and high frequency distortions unchanged.

When cascading two or more circuits in circuit 15 of FIG. 3 with or without gain, it is possible to change distortion profiles by addition or cancellation of even or odd orders of harmonic distortion.

In FIG. 4A, the high input impedance VR1/C2 provides a low output impedance on transistors Q1/Q2 providing a sequential downward trending of both even and odd harmonics as the orders increase. This provides diminishing orders of harmonic content for balancing of the overall harmonic distortion spectrum where both even and odd orders are required.

In FIG. 4B, the input impedance VR1/C2 is approximately the same as the source impedance resulting in a moderate output impedance on transistors Q1/Q2 providing a dominant third order harmonic distortion with very low even orders of harmonic distortion. This has limited application other than where 3rd order harmonics need to be added specifically to balance the spectrum.

In FIG. 4C, the input impedance VR1/C2 is slightly higher than the source impedance resulting in less than moderate output impedance on transistors Q1/Q2 providing dominant even order harmonics with reduced odd order harmonics and decreasing amplitudes as the orders of harmonics distortions increase. This provides additional content for an already balanced spectrum or where additional even orders of harmonics are necessary to balance the spectrum.

In FIG. 4D, the low input impedance VR1/C2 provides a high output impedance on transistors Q1/Q2 providing dominant odd order harmonics with decreasing amplitude for both odd and even as the orders increase. At the extreme this condition will overload the audio signal with too much harmonic distortion so the application is limited to adding increased orders of both even and odd orders of harmonic distortion when considered necessary to balance the harmonic distortion spectrum.

It is important to note that FIGS. 4A, 4B, 4C and 4D are simplified examples and their harmonic behaviour continues beyond h4. It is also important to note that FIGS. 4A, 4B, 4C and 4D are examples of the variability of the HBA circuit which is not strictly limited to these four loading examples and could, therefore, have any load necessary to achieve the spectrum of harmonic distortion desired.

Figure 4G:
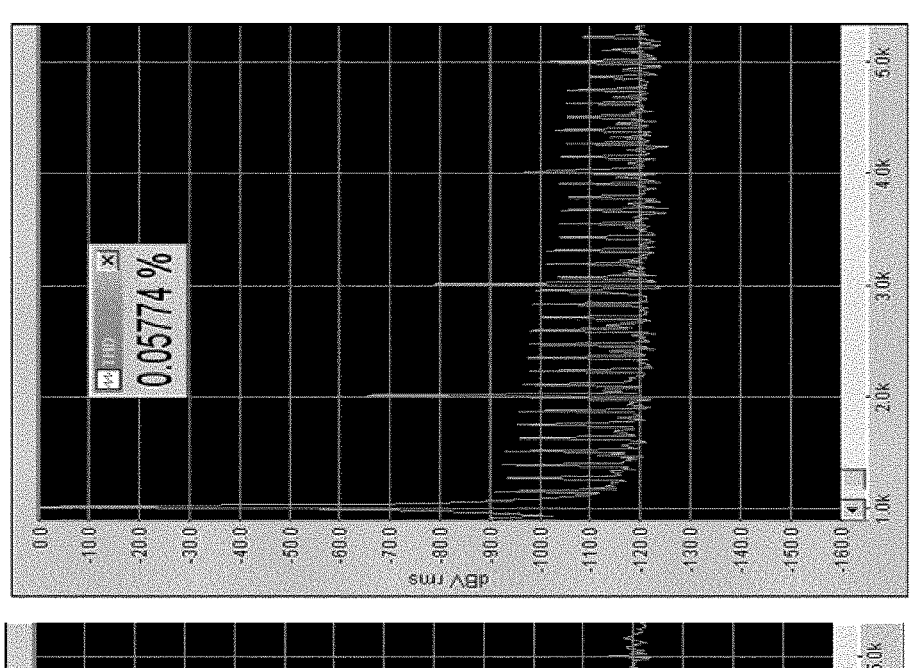
FIGS. 4E to 4G are plots of measured THD residual for a power amplifier prototype showing minimum THD of a preamplifier, optimized THD of a preamplifier and overall amplifier THD resulting from minimum preamplifier THD, respectively.
Figure 4F:
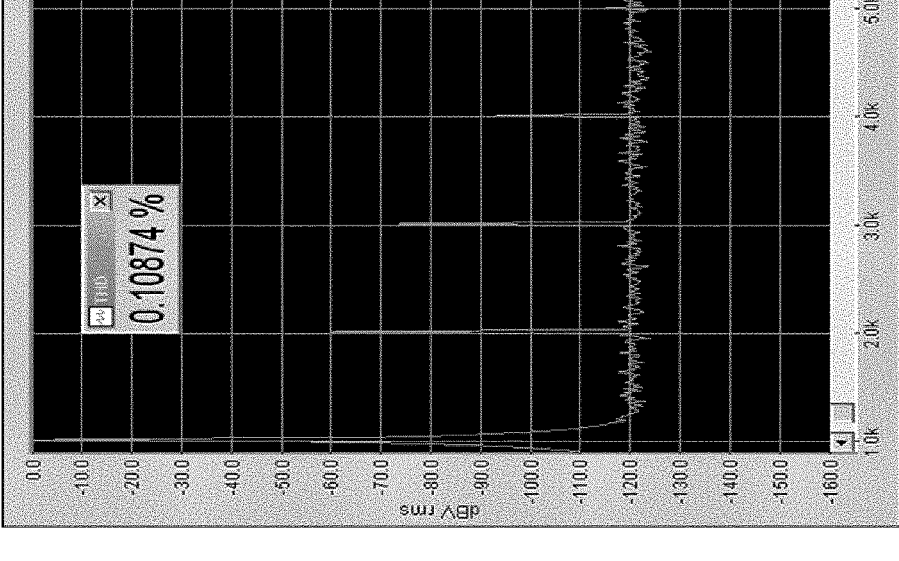
Figure 4E:
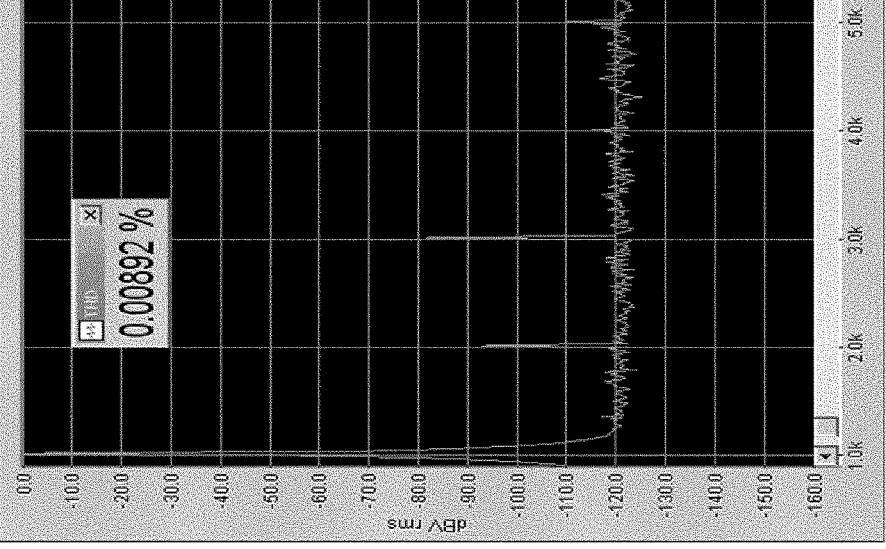

FIGS. 4E, 4F and 4G show measured THD from a test power amplifier circuit having a preamplifier circuit and a 100-watt power amplifier circuit. The preamplifier has a sine wave generator with a THD of 0.00002% at 2 Vrms into 30 kOhm load, and internal impedance of 20 Ohm. The pre-amplifier circuit power supply voltage is +1-20 VDC. The output voltage is 7.5 Vrms, the load is 15 kOhm, the input impedance is 30 kOhm, the gain is 20 dB and the bandwidth is 300 kHz. The power amplifier circuit is 100 watts at 4 Ohms for a power output of 25 Wrms into a 4 Ohm load. As shown in FIG. 4E, the measured preamplifier THD is 0.00892% with the distortion at 3 kHz greater than at 2 kHz. In FIG. 4F, the optimized preamplifier (as in FIG. 3) can provide a THD of 0.10874%, namely greater than the minimum THD of the preamplifier, however, with the harmonic distortion having decreasing energy with order 2, 3, 4 and 5. The resulting power amplifier output shown in FIG. 4G maintains this harmonic distortion having decreasing energy with order 2, 3, 4 and 5.

Figures 5A, 5B:
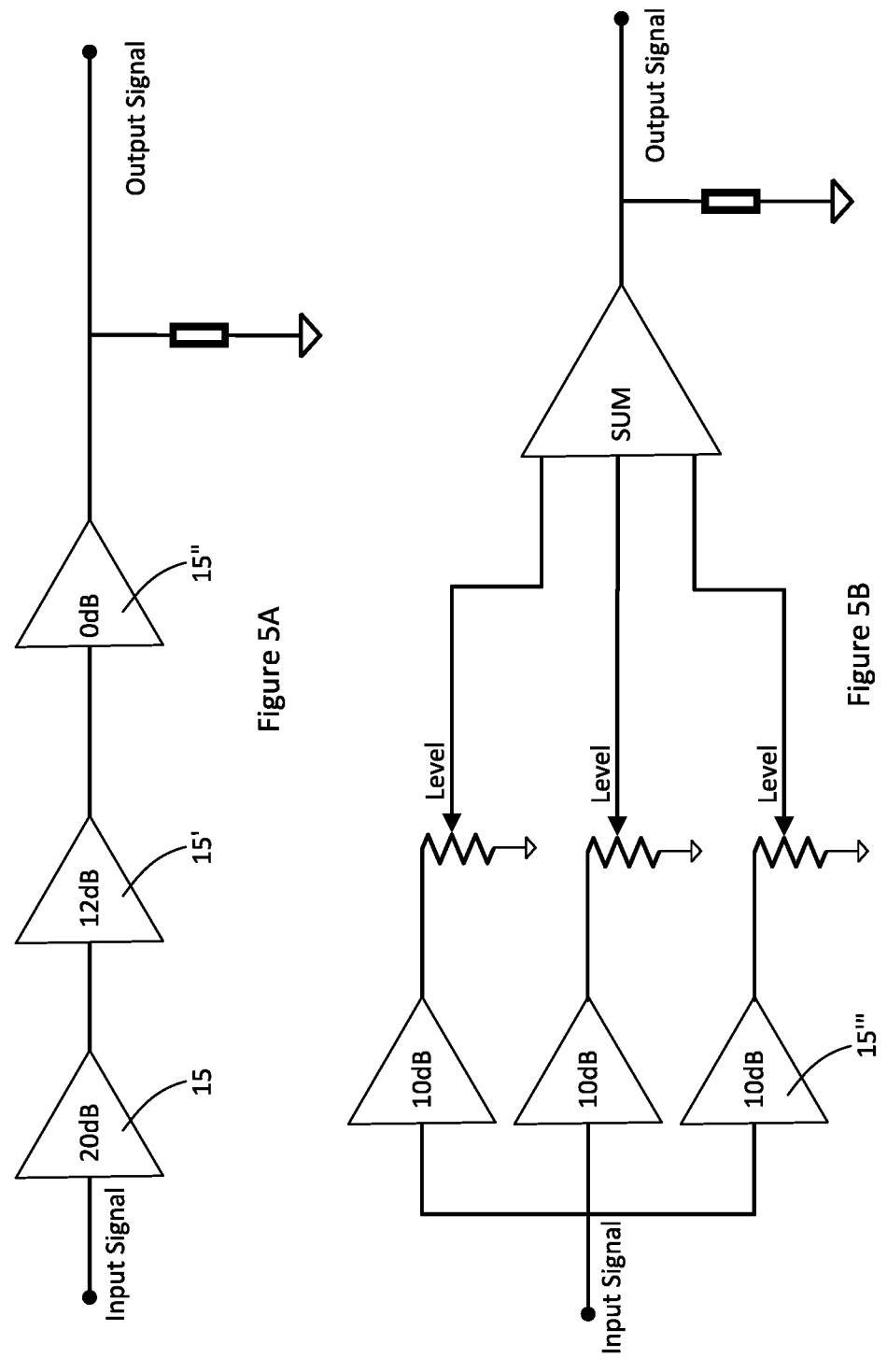
FIG. 5A is a schematic diagram showing one of the Applicant's alternate embodiments in which multiple amplifier circuits of the type identified in FIG. 3 are cascaded and arranged and adjusted to form a single compound audio amplifier circuit for the purposes of creating customization in the harmonic spectrum beyond the variability demonstrated in FIGS. 4A,B,C & D.
FIG. 5B is a schematic diagram showing another of the Applicant's alternate embodiments in which multiple amplifier circuits of the type identified in FIG. 3 are paralleled, arranged and adjusted to form a single compound audio amplifier circuit for the purposes of creating customization beyond FIGS. 4A, B, C & D and FIG. 5A options necessary to balance the overall spectrum of harmonic distortion.

As will be appreciated, an audio power amplifier circuit with an output characteristic similar to FIG. 4B combined with a pre-amplifier circuit similar to FIG. 4C will provide a combined effect similar to 4A and will have a perceived quality with less fatigue and greater intelligibility than combining a power amplifier and a pre-amplifier that are both similar to FIG. 4B. FIGS. 5A and 5B shows two different topology adaptions of FIG. 3 to achieve this.

FIG. 5A is a schematic diagram showing other embodiments in which amplifiers 15, 15' and 15" are cascaded and arranged by using different gain configurations. By giving different harmonic distortion characteristics to each of the amplifiers 15, 15' and 15" in the series, the spectrum of the harmonic distortion can be balanced using more complex configurations. The circuit of FIG. 5A can operate as either a power amplifier or pre-amplifier by varying the gain design of each of the stages.

FIG. 5B is also a schematic diagram showing an alternate embodiment in which amplifiers 15" are arranged in parallel with adjustable gain levels and a vector sum circuit to generate various distortion spectrum profiles necessary for balancing the overall spectrum of harmonic distortion. The circuit of FIG. 5B can operate as either a power amplifier or pre-amplifier by varying the gain design of each of the stages.

Figure 6A:
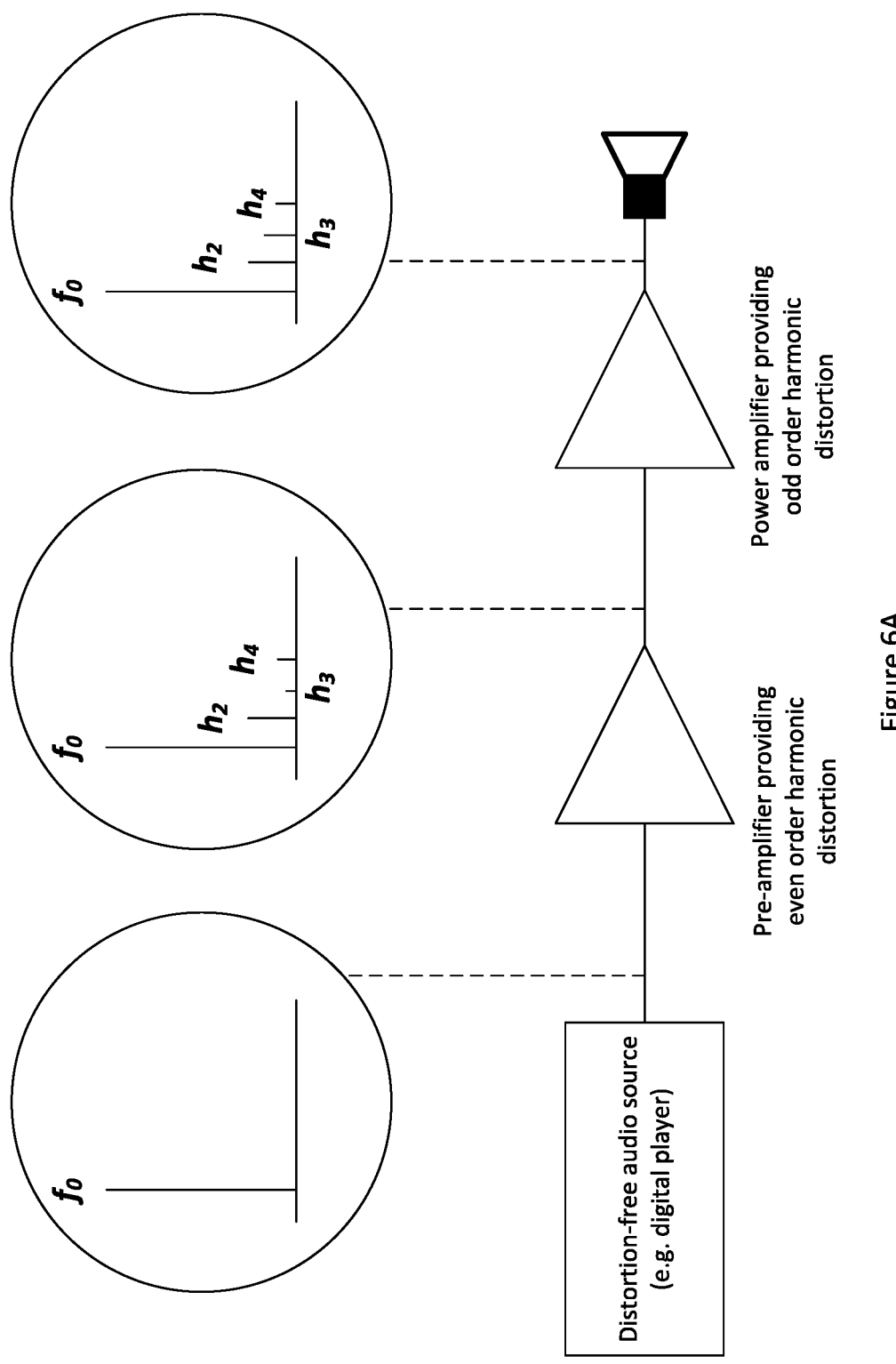
FIG. 6A is a schematic diagram that demonstrates alternate embodiments using both pre-compensation and post-compensation capabilities of the Applicant's design. Using multiple audio amplifier apparatus including a low distortion audio source, a pre-amplifier, a power amplifier and a transducer such as a loudspeaker, an alternate embodiment for a stand-alone piece of equipment designed to complement the overall distortion spectrum of the entire system whereby the output at the power amplifier outputs has balanced orders of distortion.

FIG. 6A demonstrates pre-compensation and post-compensation capabilities of the Applicant's design which can be used whether the source audio signal is transmitted via wired or wireless transmission. Considering the orders of harmonic distortion of the transmission medium in addition to the receiver and amplifiers at the receiving end allows a pre-compensated spectrum to be transmitted resulting in balanced orders of distortion at the speaker outputs of the receiving amplifier. Post compensation alternatively can be implemented to provide for a similar balanced order of harmonic spectrum at the speaker outputs.

FIG. 6A also demonstrates pre-compensation for the orders of harmonic distortion at the transducer level using the Applicant's design. Considering the orders of harmonic distortion of the transducer in addition to the other amplifiers in the overall system allows a pre-compensated spectrum to be transmitted to the transducer resulting in an acoustic output that conforms to a balanced spectrum of distortion.

FIG. 6A can be further demonstrated using actual test result measurements as provided in FIGS. 6B, 6C, 6D and 6E.

Figure 6B:
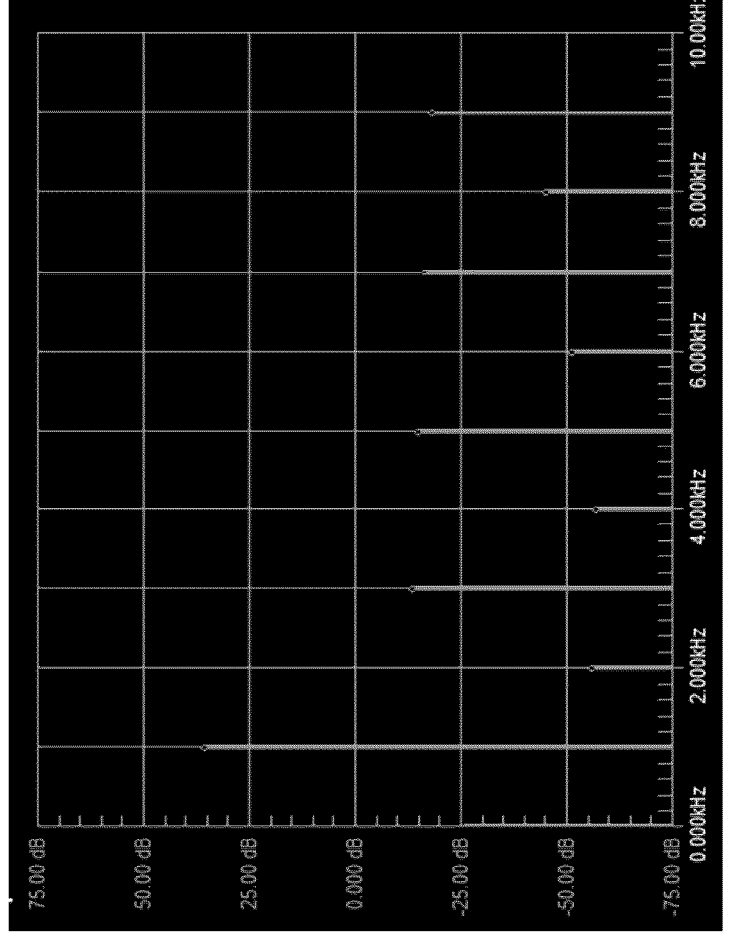
FIG. 6B is a graph of the fundamental distortion of a typical solid-state preamplifier reproducing a 1 kHz sine wave input signal.

FIG. 6B is a graph of the fundamental distortion of a typical solid-state preamplifier reproducing a 1 kHz sine wave input signal with negligible 0.00002% THD at 2 Volts RMS into a 30 kOhm load and a preamplifier internal impedance of 20 Ohm. The circuit power supply is +/−20 Volts DC with an output voltage of 7.5 Volts RMS into a 15 kOhm load. The gain of the circuit is 20 dB and the bandwidth of the preamplifier is 300 kHz. Similar to the solid-state amplifier distortion graph depicted earlier in FIG. 1, FIG. 6B demonstrates an unbalanced spectrum of distortion common to most solid-state preamplifiers.

Figures 6C, 6D, 6E:
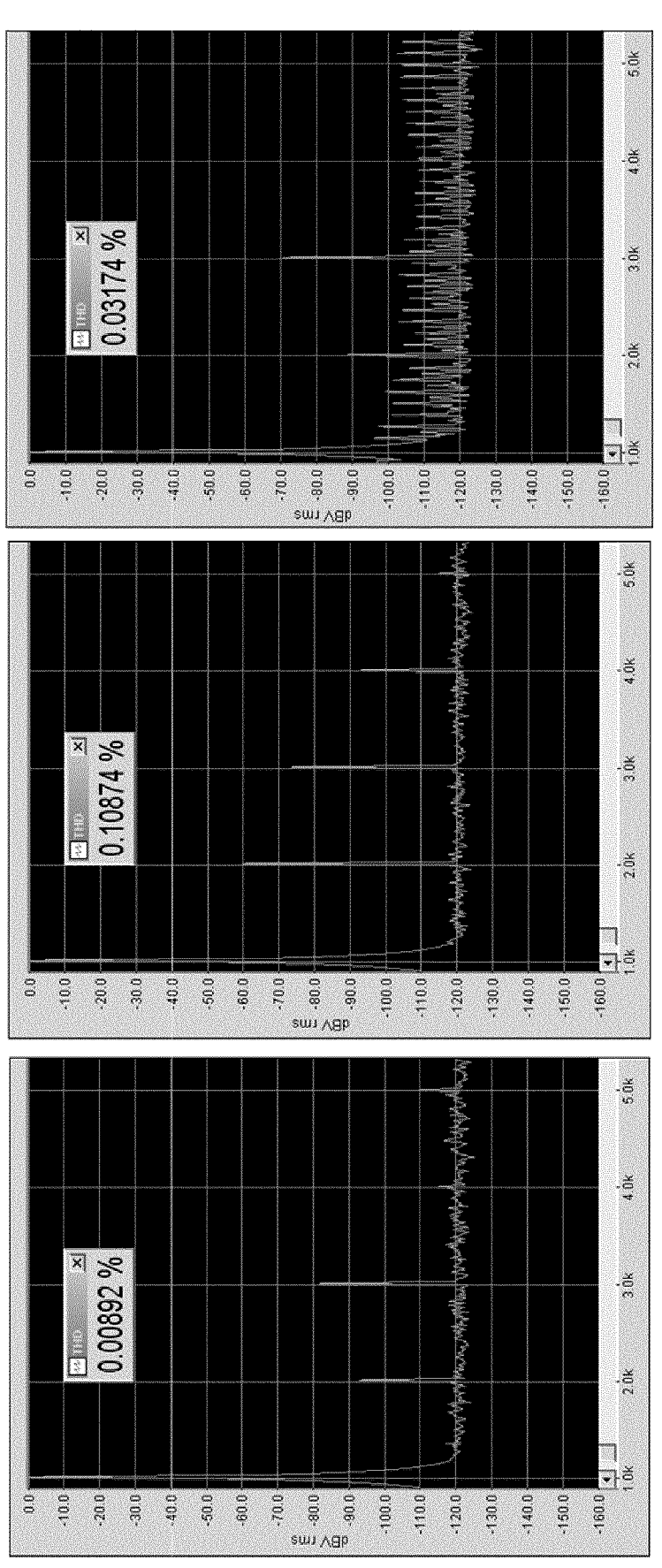
FIG. 6C is a graph of the fundamental distortion of the same aforementioned solid-state preamplifier depicted in FIG. 6B.
FIG. 6D is a graph of the fundamental distortion of a typical 100-Watt total power off-the-shelf solid-state power amplifier.
FIG. 6E is the compound effect of all harmonic distortions as measured at the power amplifier output.

FIG. 6C is a graph of the fundamental distortion of the same aforementioned solid-state preamplifier depicted in FIG. 6B but with the Applicant's embodiment adjusted to balance the overall output of the system. Providing compensation at the preamplifier also provides pre-compensation for the power amplifier which results in a balanced output at the speaker terminals. Similar to the FIG. 4A effect, the distortion has been altered from a dominant odd order spectrum to a sequential downward trending spectrum of both even and odd order harmonics as the orders increase.

FIG. 6D is a graph of the fundamental distortion of a typical 100-Watt total power off-the-shelf solid-state power amplifier which is designed to produce an output of 25 Watts RMS power into a 4 Ohm load. The even order harmonic distortions are not dominant in comparison to the respective odd orders of harmonic distortions. Though typical for a solid-state amplifier, the orders of harmonic distortion are considered unbalanced as are most solid-state amplifiers.

FIG. 6E is the compound effect of all harmonic distortions as measured at the power amplifier output having the Applicant's embodiment for balancing the entire compound system located at the preamplifier. The system's combined orders of distortion represent a more balanced spectrum overall as measured at the power amplifier output. Although all of the equipment is solid-state, the compound spectrum of the orders of distortion measure closer to how a vacuum tube system would measure. The subjective performance of this compound system would be less fatiguing and more intelligible than without the harmonic adjustment provided in FIG. 6C.

Figure 7:
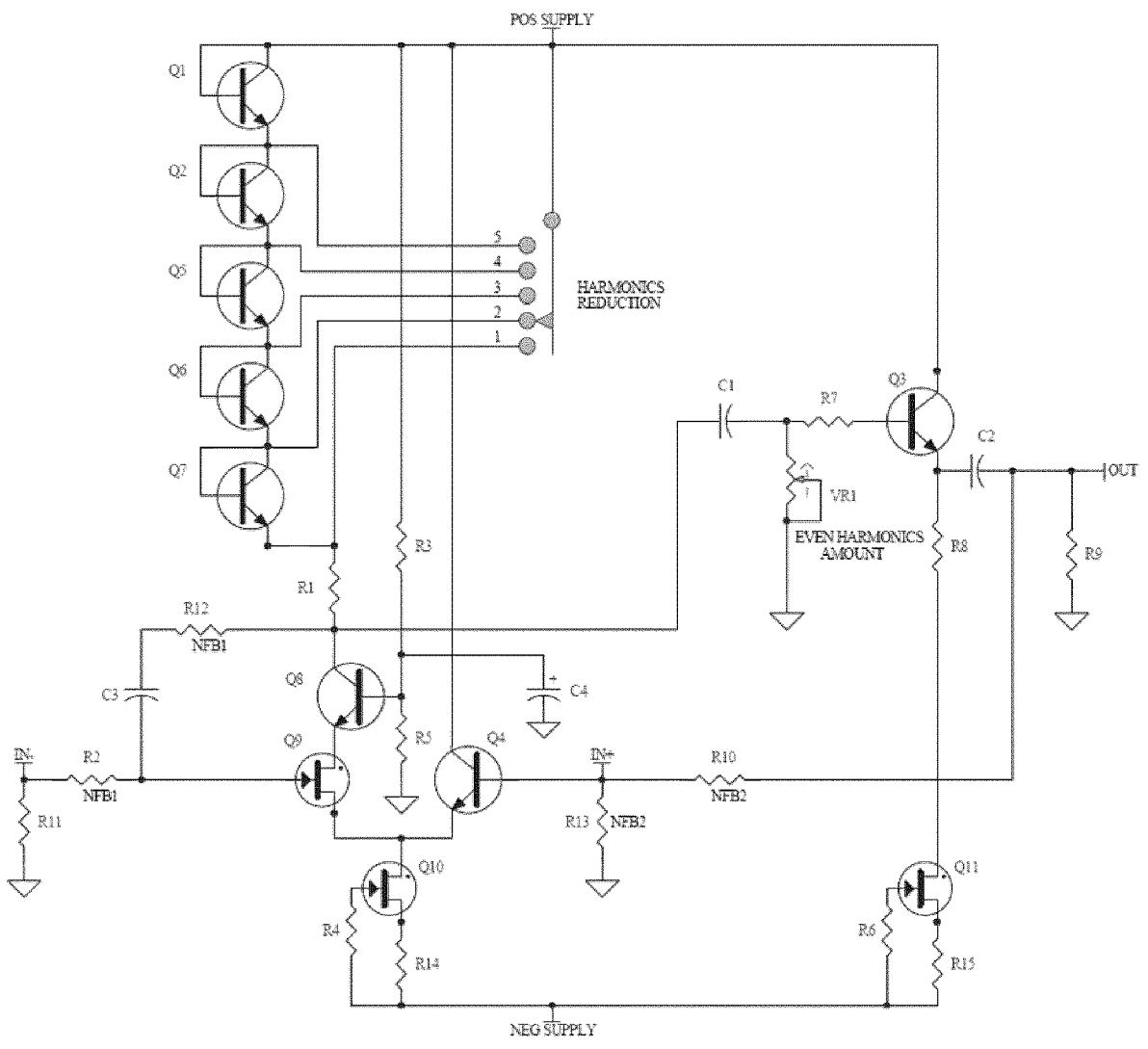
FIG. 7 is a schematic circuit diagram of a more complex circuit using an adjustable current source and a harmonic reduction circuit as a further embodiment of the Applicant's design.

FIG. 7 illustrates an example of the Applicant's HBA circuit embodiment with a provision for harmonic distortion profile adjustment which can reduce the overall harmonic content. The topology is a J-FET/bipolar cascade stage with Q9 and Q8, biasing is provided by a J-FET Q10 working as a constant current source and biased by R4 and R14. Q8 base potential is produced by R3 and R5 and stabilized by C4. At the gate circuit of Q9 there is a biasing return resistor R11 and a network composed by R2, R12, and C3. This network is a local negative feedback around Q8 and Q9, and it provides a gain reduction and stabilization so as to change the current/voltage (I/V) curves of the circuit. The change in I/V curves forces the circuit to produce a predominant even harmonic distortion profile by bending its transfer function.

Figure 8:
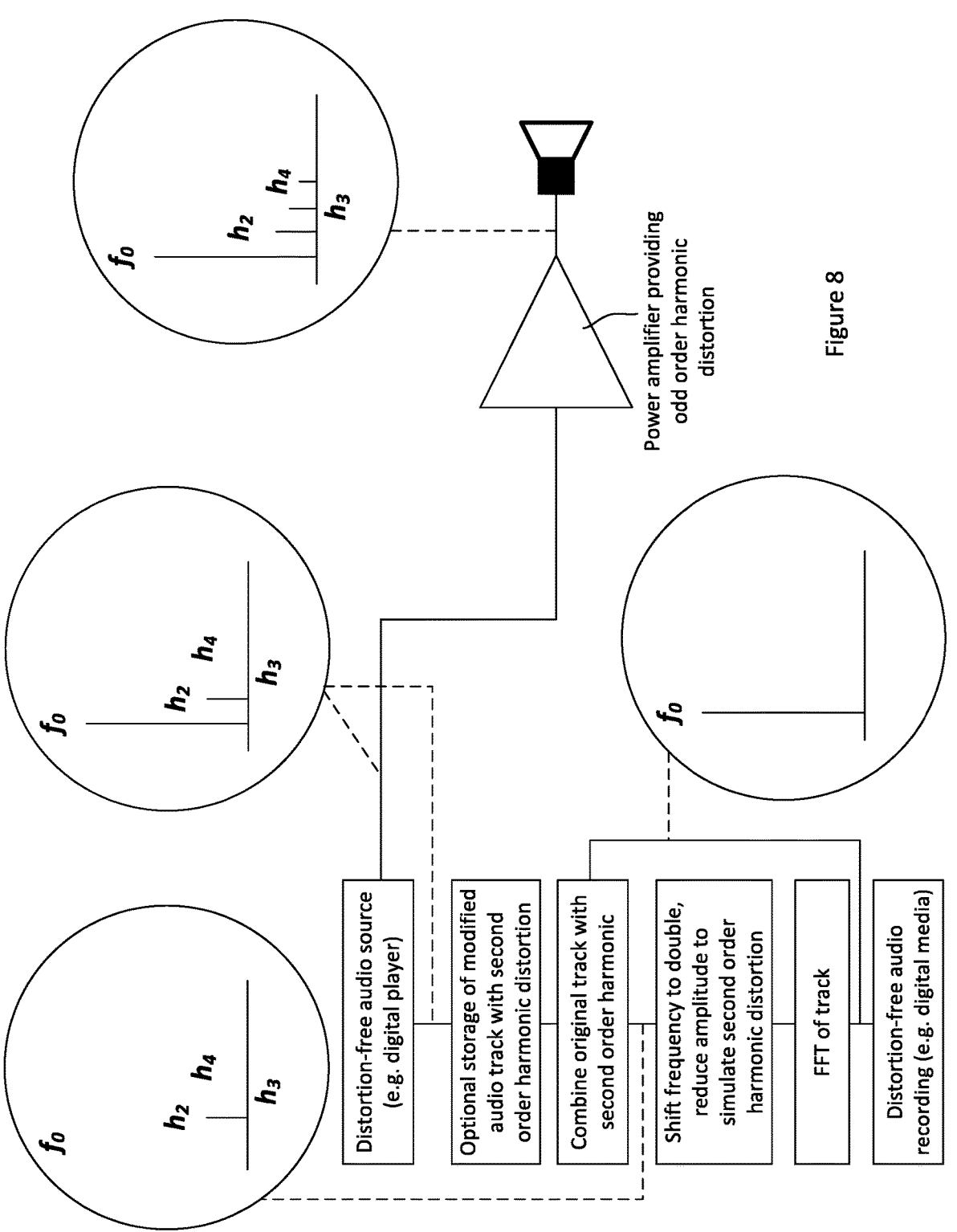
FIG. 8 is a schematic diagram of a digital audio playback apparatus including an audio signal processor that creates and combines a desired order of harmonic distortion to the audio track. In this simplified example, a conventional solid-state power amplifier with dominant odd order harmonics of distortion can be balanced to have an output similar to the dominant even order harmonic spectrum in FIG. 2 to provide a sound that is characterized as less fatiguing and more intelligible. With this example, a solid-state amplifier now has a harmonic distortion spectrum of a vacuum tube amplifier.

The collector load resistor R1 of Q8 and bipolar transistors Q1, Q2, Q5, Q6 and Q7 form the output circuit of the amplifier. The transistor string in the output circuit is in fact an active load. By using the "Harmonics reduction" selector as shown in FIG. 8, it is possible to reduce progressively the amount of harmonic distortion by successive bending of the transfer function in a way to adjust the amount of harmonic residuals produced by the circuit.

By selecting the amount of negative feedback around the Q8 and Q9 stage, the profile can be adjusted to be mostly odd or mostly even harmonics. Q8 and Q9 are selected for non-linearity in their I/V curve with a curve tracer. Transistor Q9 can be replaced with a bipolar transistor in order to get a different distortion profile. The control VR1 is used to progressively increase the amount of even harmonics by progressively loading the collector of Q8.

Q3 and Q11 form a linearized emitter follower whose purpose is to convert high input impedance to low output impedance. The linearization is provided by constant current source Q11 and associated components.

An overall negative feedback at R10 and R13 is used to control the overall gain of the complete circuit and is coupled to the source of Q9 by emitter follower Q4. Emitter follower Q4 is providing isolation between input and output circuits.

With this non-linear amplifier circuit, it is possible to adjust both the overall amplitude of the distortion and almost individually the even and odd orders of harmonic distortions to achieve an overall balanced harmonic spectrum.

FIG. 8 is also a schematic diagram of a digital audio playback apparatus including an audio signal processor that creates and combines a desired order of harmonic distortion to the audio track—in this case a second order harmonic distortion. This apparatus is not limited to 2nd orders of harmonic distortion but can be used for any order of harmonic distortion. This can be used for mastering the original media file to pre-compensate for harmonic distortion deficiencies in typical playback equipment or to improve the actual harmonic distortion spectrum in the master media file.

A digital performance embodiment of the analogue circuit described in FIG. 3 using a Digital Signal Processor (DSP) can also achieve similar distortion spectrums as identified in FIGS. 4A, B, C & D, 5A & B and 6A in the balancing of the overall spectrum. With a DSP, a second order harmonic signal can be generated and then added to the original track. This can be achieved by processing the original track to obtain a FFT dataset which can then be shifted to create the second order harmonic. The amplitude of the dataset can be attenuated to correspond to the desired second order harmonic requirement. In order to combine the original track with the second order harmonic of distortion track, the FFT dataset can be converted using an inverse transform to a time track and then mixed with the original track. The resultant track can be either stored in its modified digital form for subsequent playback or played in real-time without any long-term storage. The resultant modified track now contains second order harmonic distortion. Any other significant orders of harmonic distortions similar to those identified in FIGS. 4A, B, C & D, 5A & B and 6A can be added to balance the overall harmonic spectrum.

In either the analogue or digital domain, this technique can be used to correct unbalanced orders of harmonic distortion associated with various technologies involved at the time of the original master recording. The new remastered copy with balanced orders of harmonic distortion will sound subjectively less fatiguing and more intelligible.

In some embodiments, the improved audio amplifier can be used in a hearing aid. A hearing aid microphone provides the audio signal source and the amplified audio signal with the correct balance of THD is provided to the output audio transducer of the hearing aid to provide for less fatiguing and more intelligible hearing enhancement.

What is claimed is:

1. An audio signal power amplifier system comprising:
a non-linear pre-amplifier having near unity or low gain comprising:
a high impedance input;
a low impedance output;
an input stage connected to said high impedance input, said input stage comprising a transistor amplifier circuit including an adjustable load that causes, in use, said input stage to exhibit as a function of said adjustable load different relative amounts of second order harmonic distortion energy and third order harmonic distortion energy;

an output stage connected to said input stage and to said low impedance output; and a non-linear power amplifier receiving said output stage, comprising a transistor circuit generating negligible second and fourth order harmonic distortion and non-negligible third and fifth order harmonic distortion, wherein said system provides higher second order harmonic distortion energy than third order harmonic distortion energy with decreasing energies at progressively higher order harmonics at an output of said non-linear power amplifier in response to an input audio signal provided to said high impedance input, wherein a total harmonic distortion generated by said non-linear power amplifier is less than 0.5% of a signal amplitude at said low impedance output.

2. The audio signal power amplifier system as defined in claim 1, wherein said adjustable load of said input stage comprises a transistor string to reduce an amount of harmonic distortion by bending of a transfer function of said transistor amplifier circuit.

3. The audio signal power amplifier system as defined in claim 2, wherein said transistor string comprises a selector switch for selecting a number of transistors active in said transistor string.

4. The audio signal power amplifier system as defined in claim 1, wherein said adjustable load of said input stage comprises a variable resistance able to change said adjustable load to change a balance of said second order harmonic distortion energy with respect to said third order harmonic distortion energy.

5. The audio signal power amplifier as defined in claim 1, wherein said total harmonic distortion generated by said non-linear power amplifier is less than 0.3% of said signal amplitude at said low impedance output.

6. The audio signal power amplifier as defined in claim 1, wherein the adjustable load of said transistor amplifier circuit causes greater second order harmonic distortion energy than third order harmonic distortion energy to be produced in said transistor amplifier circuit.

7. The audio signal power amplifier as defined in claim 6, wherein said adjustable load comprises a transistor string to reduce an amount of harmonic distortion by bending of a transfer function of said transistor amplifier circuit, and said adjustable load is adjusted by selecting a number of transistors in said transistor string.

8. The audio signal power amplifier as defined in claim 6, wherein said transistor amplifier circuit produces said second order harmonic distortion energy more than 5 dB greater than said third order harmonic distortion energy.

9. The audio signal power amplifier as defined in claim 1, wherein said output of said non-linear power amplifier has a fourth order harmonic distortion energy less than said third order harmonic distortion energy.

10. The audio signal power amplifier as defined in claim 1, wherein said output of said non-linear power amplifier has fifth and higher orders of harmonic distortion energy that are imperceptible to an average adult human hearing.

11. The audio signal power amplifier as defined in claim 1, further comprising a hearing aid microphone, wherein the input audio signal is generated by the hearing aid microphone.

12. The audio signal power amplifier as defined in claim 1, wherein a composition of total harmonic distortion in an audio output signal of said audio signal power amplifier has a balance of odd and even order harmonic distortion energy that includes greater second order harmonic distortion energy than third order harmonic distortion energy.

13. An audio signal playback system comprising:

a processor configured to receive an input soundtrack and to produce a second order harmonic copy thereof;

a mixer configured to mix said input soundtrack with said second order harmonic copy to produce a simulation of second order harmonic distortion energy within said input soundtrack in a mixed soundtrack;

a non-linear power amplifier receiving said mixed soundtrack, comprising a transistor circuit generating negligible second and fourth order harmonic distortion energy and non-negligible third and fifth order harmonic distortion energy, wherein said system provides higher second order harmonic distortion energy than third order harmonic distortion energy with decreasing energies at progressively higher order harmonics, wherein a total harmonic distortion generated by said non-linear power amplifier is less than 0.5% of a signal amplitude at an output of said non-linear power amplifier.

14. The audio signal playback system as defined in claim 13, wherein said total harmonic distortion generated by said non-linear power amplifier is less than 0.3% of said signal amplitude at said output of said non-linear power amplifier.

15. The audio signal playback system as defined in claim 13, wherein said output of said non-linear power amplifier has a fourth order harmonic distortion energy less than said third order harmonic distortion energy.

16. The audio signal playback system as defined in claim 13, wherein said output of said non-linear power amplifier has fifth and higher orders of harmonic distortion energy that are imperceptible to an average adult human hearing.

17. The audio signal playback system as defined in claim 13, wherein a total harmonic distortion generated by said non-linear power amplifier is less than 0.3% of said signal amplitude at said output of said non-linear power amplifier.

* * * * *